United States Patent
Nyström et al.

[11] Patent Number: 5,135,801
[45] Date of Patent: Aug. 4, 1992

[54] DIFFUSION BARRIER COATING MATERIAL

[75] Inventors: Åsa K. Nyström, Kista; Jan N. Lindström, Hägersten; Mats E. C. Sjöstrand, Kista; Leif E. A. Åkesson, Älvsjö, all of Sweden

[73] Assignee: Sandvik AB, Sandviken, Sweden

[21] Appl. No.: 205,690

[22] Filed: Jun. 13, 1988

[51] Int. Cl.$^5$ .............................................. B32B 7/02
[52] U.S. Cl. .................... 428/216; 428/212; 428/336; 428/408; 428/469; 428/472; 428/698; 428/699; 428/701; 428/702
[58] Field of Search .............. 428/469, 472, 698, 699, 428/408, 344, 336, 212, 213, 215, 332, 334, 701, 702, 216

[56] References Cited

U.S. PATENT DOCUMENTS

| | | | |
|---|---|---|---|
| 2,972,556 | 2/1961 | Vrahiotes et al. | 428/698 X |
| 3,911,188 | 10/1975 | Torti, Jr. et al. | 428/698 X |
| 4,018,631 | 4/1977 | Hale | 428/698 X |
| 4,035,541 | 7/1977 | Smith et al. | 428/698 X |
| 4,101,703 | 7/1978 | Schintlmeister | 428/698 X |
| 4,282,289 | 8/1981 | Kullander et al. | 428/698 X |
| 4,341,834 | 7/1982 | Kikuchi et al. | 428/336 |
| 4,447,263 | 5/1984 | Sugizawa et al. | 428/698 X |
| 4,490,191 | 12/1984 | Hale | 428/215 |
| 4,525,415 | 6/1985 | Porat | 428/698 X |
| 4,693,944 | 9/1987 | Sugisawa et al. | 428/699 |
| 4,734,339 | 3/1988 | Schachner et al. | 428/698 |
| 4,746,563 | 5/1988 | Nakano et al. | 428/698 X |

FOREIGN PATENT DOCUMENTS 0248879  12/1985  Japan ................................ 428/698

*Primary Examiner*—Ellis P. Robinson
*Assistant Examiner*—Archene Turner
*Attorney, Agent, or Firm*—Burns, Doane, Swecker & Mathis

[57] ABSTRACT

A coated body consisting of a substrate that can be decarburized during a carbide, nitride or carbonitride coating process comprising a first (innermost) carbon diffusion retarding coating of MetCO, MetCON, MetON adjacent to the substrate and a second (next innermost) wear resistant coating of MetC, MetN and/or MetCN, where Met is Ti, Hf, V, Zr, Si, B or other metals of subgroup 3-7 of the periodic table of the elements, or a mixture thereof. The intermediate coating has been found beneficial in order to reduce or even eliminate the formation of eta phase in the substrate.

16 Claims, 1 Drawing Sheet

DIFFUSION BARRIER COATING MATERIAL

The present invention relates to sintered cemented carbide bodies coated with thin, extremely wear resistant surface layers. More particularly, it relates to coated cemented carbide bodies in which a thin oxygen containing layer has been deposited adjacent to the substrate and shown to improve the properties of the coated body.

Coated cutting tools are widely used in the machining industry to machine iron and iron based alloys. Increasing the life time of such tools by carbide, nitride, carbonitride and oxide coatings, is a well established technology. Cutting inserts are usually coated with layers consisting of one or more of carbide, nitride or carbonitride of titanium or a related metal. In some cases the coatings also include an outer layer of oxide, such as $Al_2O_3$ or $ZrO_2$.

Alumina or zirconia cannot conveniently be deposited directly onto a cemented carbide substrate by the conventionally used Chemical Vapour Deposition (CVD) process. Henceforth, it is a common practise to deposit a layer of carbide, carbonitride and/or nitride of titanium prior to the deposition of $Al_2O_3$ and/or $ZrO_2$.

In certain prior art instances such as in U.S. Pat. No. 4,341,834, U.S. Pat. No. 4,463,033 and EP 83043, TiCO or TiCON are used as an intermediate coating between the substrate and an oxide coating, or alternatively between an underlying TiC, Ti(C,N) or TiN coating and an oxide coating superimposed, in order to improve the adhesion between the oxide coating and the coating-/substrate beneath. In U.S. Pat. No. Re. 29 420 it is disclosed to oxidise (or nitride) the hard metal surface prior to the TiC coating in order to cause eta phase formation in the substrate. It is also disclosed in this reissue patent how to oxidize (or nitride) an intermediate TiC or TiN coating prior to further coating with alumina. In this case these process steps are advantageous in connection with deposition and adhesion of the outer $Al_2O_3$ coating. In JP 54-68779 is disclosed how to use certain coloured oxygen containing and non-oxygen containing layers to facilitate the separation of used and not used cutting tip edges. The use of oxygen containing layers is only recommended if these layers are coloured. The recommended thickness of these coloured coatings is at least 2 $\mu$m. DE 30 39 772 discloses the use of alumina as an intermediate layer between the cemented carbide substrate and the major wear resistant coating layer.

When a cemented carbide tool is coated with a wear resistant carbide, carbonitride or nitride by a CVD-process (at about 800°–1200° C.), diffusion of carbon from the substrate into the coating occurs. A well-known problem, which accompanies this diffusion is the formation of a carbon deficient, brittle phase in the substrate adjacent to the deposited carbide, carbonitride or nitride. Such a phase, is in the case of a cemented carbide substrate commonly called eta-phase and consists of $Co_3W_3C$, $Co_6W_6C$ and/or other similar phases.

Because the decarburization of a cemented carbide substrate is most severe in the cutting edge due to a large gas volume to surface area ratio and a large surface area to substrate volume ratio the formation of eta-phase is most pronounced at the edge. This fact causes a reduction in tool life in certain machining operations, e.g. in intermittent cutting such as milling and parting. In these cases the brittle eta-phase is often detrimental to the properties of the cutting edge and it is of importance to keep the amount of embrittling eta-phase low.

Different methods and procedures have been practised to reduce the amount of etaphase beneath the coatings such as the use of $Al_2O_3$ intermediate coatings or TiN coatings as a first layer or simply to use high deposition rate coating conditions (less decarburizing). In the latter case, however, the possibility of obtaining TiC-coatings of the same thickness throughout an extended coating batch containing e.g. thousands of inserts to be coated is often seriously reduced. In other cases the interlayers cause disturbed growth of the TiC-layer or are of limited efficiency in reducing the eta-phase and/or is detrimental to the adherence properties.

It has surprisingly been found that a thin intermediate layer of $TiC_xO_y$, or $TiC_xO_yN_z$ between the cemented carbide substrate and a wear resistant coating of at least one layer of TiC, TiN or TiCN reduces the carbon diffusion from the substrate into the coating and, consequently, inhibits or retards the formation of the brittle eta-phase. $x+y+z$ shall be $<1.3$, preferably $0.5<x+y+z<1.05$ and most preferably $0.8<x+y+z<1.05$, $y>0.1$, preferably $y>0.2$ and $x+z$ preferably $>0.05$ most preferably $>0.1$. The intermediate coating may be as thin as about 0.05 $\mu$m, preferably $>0.2$ $\mu$m, up to 5 $\mu$m, preferably up to 2 $\mu$m thick and most preferably up to 1 $\mu$m. The second layer shall have a thickness of $>0.2$ $\mu$m, preferably 0.5–20 $\mu$m and most preferably 1–10 $\mu$m. The intermediate layer is preferably thinner than, most preferably less than 75%, of the wear resistant coating. The intermediate layer is efficient even when its thickness is 2–25% of the total coating thickness.

The intermediate layer may consist of successive layers. Furthermore, on top of the wear resistant coating further layers may be deposited. For example a third layer of $Al_2O_3$, optionally with a fourth layer of TiN may be deposited. Another alternative is multi-layer coatings such as disclosed in GB 20 48 960 and DE 23 41 783.

A thin layer 0.1–1 $\mu$m, preferably 0.2–0.7 $\mu$m thick may be deposited between the oxygen containing layer and the substrate as long as decarburization of the substrate does not occur to any appreciable extent. The reason for the deposition of such a very thin layer may be to enhance the adhesion or induce metal into the overlying coating or substrate to improve the ductility in the substrate coating interfacial region.

In a preferred embodiment the diffusion barrier coating material consists of a solid solution of TiC/-TiN/TiO, all compounds having the same f.c.c. crystallographic structure, the ratio between the individual anions controlled by the CVD-process parameters.

The invention is illustrated by the enclosed FIGS. 1–3.

Figure 1A:
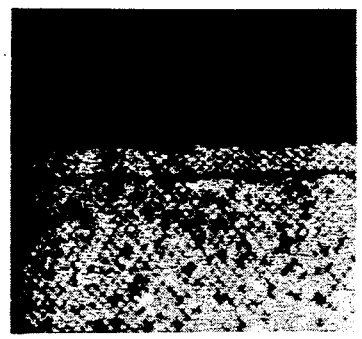
FIG. 1a shows a light optical micrograph of a polished cross section of a cemented carbide coated with an intermediate layer according to the invention. The intermediate layer appears as a dark zone between the substrate A and the superimposed coating B.
Figure 1B:
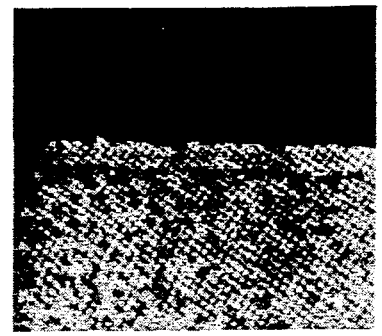
FIG. 1b shows a coated prior art insert etched in Murakami solution. The eta phase appears between the substrate and the coating.
Figure 2A:
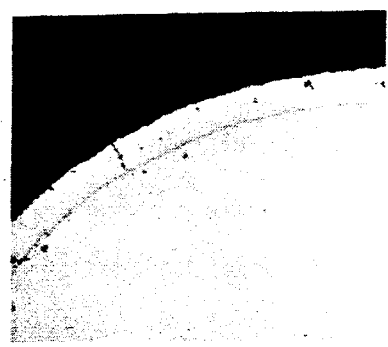
FIG. 2a shows a cross section of the edge line of a coated cemented carbide insert according to the invention.
Figure 2B:
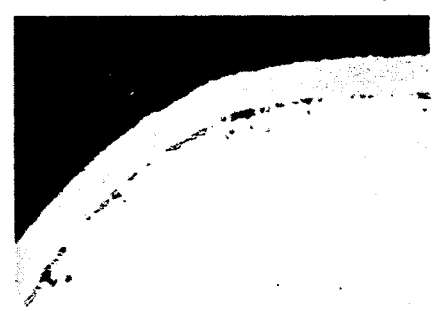
FIG. 2b shows a cross section of the edge line of a coated cemented carbide insert according to prior art.
Figure 3A:
FIGS. 3a and 3b show SEM-micrographs demonstrating the difference in edge line micro-damage after a machining test between inserts coated according to the invention and prior art coated inserts. The insert coated according to prior art reveals severe damages in the edge line area whereas the insert coated according to the invention shows an undamaged edge line.
Figure 3B:

The effect of oxygen in the diffusion barrier coating as a decarburization inhibitor is surprising because oxygen in the process gas is known as a highly decarburizing agent, for instance, in the case of moisture content in protection gases for furnace treatment of cemented carbides. See further U.S. Pat. No. 3,616,506. The retarding effect on carbon diffusion is probably caused by the high affinity of oxygen to e.g. titanium. The high bonding strength between oxygen and titanium reduces the mobility of carbon in the $TiC_xO_yN_z$ lattice which in turn suppresses the diffusion of carbon.

The presence of the intermediate coating according to the invention, is particularly important when the substrate contains a high content of binder phase (Co, Ni, Fe, Mo) close to the surface region such as disclosed in e.g. U.S. Pat. No. 4,610,931 and U.S. Pat. No. 4,277,283.

The microstructure of e.g. a Co enriched surface zone varies depending on process conditions. Usually, the above mentioned zone is 10-25 $\mu$m thick and contains binder phase and tungsten carbide, WC, and no or very little cubic carbides of the B1 structure. In this zone the binder phase enrichment is most pronounced 5-15 $\mu$m from the surface.

Alternatively, the surface zone may exhibit a structure in which the binder phase is arranged in layers mainly parallel to the surface with the largest content of cobalt close to the surface, so called stratified binder enrichment. This zone is usually 15-25 $\mu$m thick and often contains a reduced concentration of cubic carbides of the B1 structure.

These binder enriched substrates, especially of the stratified type, are very prone to decarburization if submitted to conventional deposition process conditions for TiC, Ti(C,N) or TiN due to the rather large volume of cobalt containing dissolved carbon. The diffusion loss of carbon and the subsequent formation of brittle eta-phase is especially severe in such a substrate. By coating such a substrate with an oxygen-containing intermediate layer according to the invention the diffusion of carbon into the TiC, TiN and/or Ti(C,N) layer can be retarded and, consequently, the formation of ota-phase circumvented or at least minimised. In a similar way a cemented carbide substrate with a low amount of carbon dissolved in the binder phase (such substrates are often used for milling) is particularly susceptible to eta phase formation and, hence, is especially suited to be coated with the intermediate layer according to the invention.

Although the intermediate coating according to the invention is particularly useful when coating a substrate enriched in binder metal adjacent to the surface or with a low carbon content, it is also useful when coating a conventional cemented carbide substrate.

Besides cemented carbide bodies the invention is also advantageous when coating other substrates susceptible to decarburization during coating with a carbide, carbonitride or nitride. Such substrates are e.g. steels, high speed steels and titanium-based hard materials containing a binder phase of Co, Ni and/or Fe.

Instead of titanium the oxygen-containing carbon diffusion barrier layer can be based on Hf, V, Zr, Si, B or other metals of subgroup 3, 4, 5, 6, or 7 of the periodic table of the elements or a mixture thereof. Of primary interest are those of the above mentioned elements that form carbides and/or carbonitrides with solubility of oxygen, forming a $MetC_xO_yN_z$ layer (where Met is one of the above mentioned metals) in analogy with titanium although other oxygen containing compounds such as certain oxides, often combined with another coating, might have the same advantageous effect as the $MetC_xO_yN_z$-layer has. The oxygen containing intermediate layer may consist of successive $MetC_xO_yN_z$-layers.

In an analogous way also hard wear resistant carbides, nitrides or carbonitrides of Hf, V, Zr, Si, B or other metals of subgroups 3, 4, 5, 6, or 7 of the periodic table of the elements or a mixture thereof, that decarburize a substrate during deposition can be deposited onto a substrate precoated according to the invention. Such a wear resistant carbide, carbonitride or nitride coating of the above mentioned elements including titanium may also contain certain amounts of impurities or additions, e.g. oxygen, sulphur or phosphorous.

The intermediate oxygen containing layer may be deposited by chemical vapour deposition CVD, according to conventional technique previously described, see e.g. U.S. Pat. No. 3,837,896. Coating may alternatively be performed by physical vapour deposition, PVD, such as reactive magnetron sputtering, ion plating or cathodic arc discharge deposition.

The process pressure for depositing the intermediate oxygen containing layer by a CVD-process may be chosen to be either in the low pressure region, 0.1-200 mbar, or at a higher, for instance, atmospheric, pressure. The deposition temperature, when using a CVD-process, may be in the range of 800°-1200° C., preferably 900°-1050° C. The different process steps may be carried out in the same coating equipment or in separate equipments. Depending on the selection of the oxygen containing gas specie, inclusion of other atoms than nitrogen and carbon may occur e.g. sulphur, tellurium, selenium, phosphorous and/or arsenic in the $MetC_xO_yN_z$ intermediate layer.

EXAMPLE 1

Cemented carbide cutting inserts consisting of:

1. Approximately 85.9% WC, 5.5% Co and 8.6% cubic carbides (TiC-TaC-NbC), the binder phase being almost saturated with respect to dissolved carbon.

2. Identical substrate composition as above but the binderphase (Co) being far below saturation with respect to dissolved carbon, close to the eta-phase precipitation limit.

3. Identical substrate composition as above but the surface zone being depleted with regard to cubic carbides (TiC-TaC-NbC) and enriched in binder phase (Co) to a depth of about 15 $\mu$m. The binder phase is almost saturated with respect to dissolved carbon.

The above described substrates were subjected to a coating process by Chemical Vapour Deposition-technique according to the following parameters:

The cemented carbide cutting inserts were heated to 1000° C. in a reaction vessel containing altogether 900 inserts. The reaction vessel consisted of a heat resistant alloy.

A reaction gas mixture comprising 3% TiCl$_4$, 1% CO, balance H$_2$ was passed through the reaction vessel for 30 min at a flow rate of 6.5 liters/min.

This was followed by a further coating step with TiC according to the following conditions:
TiCl$_4$: 3%
CH$_4$: 10%
H$_2$: balance
Gas flow rate: 6.5 liters/min
Reaction time: 4 hours The deposition resulted in a very fine-grained TiCO-coating adjacent to the substrate, about 0.6 µm in thickness followed by a TiC-coating. See further table 1.

The different cutting inserts can be characterized in the following way. No 1 has the least pronounced tendency of etaphase formation followed by No 3 and No 2. The latter is most disposed to etaphase formation.

X-ray diffraction analysis of a coated insert of grade No 3 revealed the composition of the TiCO coating to be about TiC$_{0.2}$O$_{0.8}$.

EXAMPLE 2

Comparative Example

Carbide cutting inserts of the same composition as in example 1 were subjected to a deposition process according to the following parameters:
TiCl$_4$: 3%
CH$_4$: 10%
H$_2$: balance
Gas flow rate: 6.5 l/min
Reaction time: 4.0 hours
Temperature: 1000° C.

The deposition was carried out in the same kind of reaction vessel as in example 1 and resulted in a TiC-coating, about 5 µm thick.

Etaphase was formed on all cemented carbide substrates to a varying extent, see table 1. A comparison between example 1 and 2 points out the reducing effect on carbon diffusion from the cemented carbide insert when an intermediate TiCO layer has been deposited between substrate and the TiC-layer.

TABLE 1

| Example | Substrate | µm TiC | etaphase* |
|---|---|---|---|
| 1 | 1 | 5 | none |
|  | 2 | 5 | small traces in the edge area |
|  | 3 | 5 | none |
| 2 | 1 | 5.5 | spots of 2 µm depth in the edge area |
|  | 2 | 4.5 | 2–4 µm deep spots on both the rake face and in the edge |
|  | 3 | 5.5 | spots on the rake face and in the edge area |

*determined after etching in a Murakami solution.

EXAMPLE 3

Cemented carbide cutting inserts of type 2 in example 1 were submitted to a CVD coating process according to the following parameters:

The cemented carbide cutting inserts were heated to 1000° C. in the same reaction vessel as previously used.

A reaction gas mixture comprising 3% TiCl$_4$, 1% CO, 10% N$_2$, balance H$_2$ was passed through the reaction vessel at a flow rate of 6.5 l/min for 15 min. This was followed by further coating with TiCN according to the following conditions:
TiCl$_4$: 3%
CH$_4$: 10%
N$_2$: 10%
balance: H$_2$
Reaction time: 3 hours Subsequent coating with alumina and TiN was made according to prior art.

This resulted in a TiCON coating less than 1 µm in thickness but still fully visible in a light microscope at 1000 times magnification. The TiCON layer was followed by a TiCN layer with a thickness between 4 and 6 µm and further by Al$_2$O$_3$ and TiN coatings of 2.5 µm and 0.5 µm thickness respectively.

EXAMPLE 4

Comparative Example

Cemented carbide cutting inserts of type 2 in Example 1 were subjected to a CVD-coating process according to the following parameters.

A reaction gas mixture consisting of:
3%: TiCl$_4$
10%: CH$_4$
10%: N$_2$
balance: H$_2$
was passed through the reaction vessel.
Gas flow rate: 6.5 liters/min
Reaction time: 3 h 15 min
Temperature: 1000° C.

This was followed by an Al$_2$O$_3$-coating process and a TiN coating process as in example 3.

Eta phase was formed at the surface of the substrate as shown in table 2

TABLE 2

| Example | Substrate | µm TiC | Etaphase |
|---|---|---|---|
| 3 | 2 | 4–6 | traces less than 1 µm in depth in the edge area |
| 4 | 2 | 5–7 | 2–3 µm deep spots on rake face and in edge area |

EXAMPLE 5

Cemented carbide cutting inserts of type 1, 2 and 3 in example 1 and titanium-based hard material inserts comprising 11% Co, 5% Ni, 20% TiN, 6% TaC, 4% VC, 9% Mo$_2$C, 16% WC and 29% TiC were submitted to a CVD-coating process in the same reaction vessel as previously used, and heated to 1000° C.

A reaction gas mixture consisting of 1% N$_2$O, 3% TiCl$_4$, 3% CH$_4$ balance H$_2$ was passed through the reaction vessel for 15 minutes with a total gas flow rate of 5.6 liters/min.

A further coating step comprising a TiCN layer according to the same parameters as in examples 3 and 4 followed, the duration of this coating step being 3 hours. This resulted in a TiCON coating less than 0.5 µm in thickness and a TiCN layer 5 µm thick.

Only cemented carbide insert of type 2 showed visible amounts of etaphase after etching. The etaphase consisted of small spots reaching to a maximum depth of 1 µm in the edge area. On the rake face no eta phase was detected.

On the titanium-based hard material substrates no signs of decarburization were observed and no intermediate phases such as Ni$_3$Ti had been formed.

EXAMPLE 6

Cemented carbide cutting inserts of type 1 in example 1 were charged into a full scale coating equipment corresponding to the previously used equipment in all main respects but the size.

The reaction chamber was heated to 1000° C. and a coating process according to the following parameters was carried out.

$TiCl_4$: 3%
$CH_4$: 3%
CO: 1%
$H_2$: balance
Gas flow rate: about 8000 l/h
Time: 15 minutes This was followed by a TiC-coating process according to the following parameters:

3%: $TiCl_4$
9%: $CH_4$
balance: $H_2$
Gas flow rate: about 8000 l/h
Time: 3.5 hours The resulting TiCO-layer had a thickness of less than 0.5 μm and the total coating thickness, including the TiC-layer, was about 4.7 μm.

Eta-phase could not be detected.

EXAMPLE 7

Comparative Example

Cemented carbide cutting inserts of the same composition as in example 5 were charged in the same CVD-coating equipment as in example 6. The reaction chamber was heated to 1000° C. and the inserts were subjected to a coating process according to the following parameters.

$TiCl_4$: 3%
$CH_4$: 9%
$H_2$: balance
Gas flow rate: about 8000 l/h
Time: 3 hours 45 minutes.

The deposited TiC-layer showed a thickness of 4.0 μm.

After etching a 1 μm thick zone of eta-phase was found in the edge area.

EXAMPLE 8

Cemented carbide cutting inserts of type 1 in example 1 were submitted to a CVD coating process according to the following parameters.

The inserts were heated to 980° C. and the reaction vessel was evacuated to a pressure of 67 mbars.

A reaction gas mixture containing 4% $TiCl_4$, 1% CO, 3% $CH_4$ and balance $H_2$ was passed through the vessel for 30 minutes.

This was followed by further coating with TiCN by passing a reaction gas mixture of 4% $TiCl_4$, 4% $CH_4$, 27.5% $N_2$, balance $H_2$ for 3 h 30 min.

This resulted in a TiCO layer less than 0.2 μm thick and a subsequent TiCN coating 2 μm thick.

A 1 μm thick zone of eta-phase was found in the edge-area of the insert. On the rake face only traces of etaphase could be detected.

EXAMPLE 9

Comparative Example

Cemented carbide cutting inserts of type 1 in example 1 were subjected to a coating process according to the following parameters.

The inserts were heated to 980° C. and the reaction vessel was evacuated to a pressure of 67 mbars.

A reaction gas mixture consisting of 4% $TiCl_4$, 4% $CH_4$, 27.5% $N_2$ and balance $H_2$ was passed through the reaction vessel for 3 hours.

This resulted in a 3 μm thick TiCN layer. Etaphase had been formed on the rake face to a depth of 3 μm and in the edge area to a depth of 5 μm.

EXAMPLE 10

Cemented carbide cutting inserts of types 1, 2 and 3 in Example 1 were submitted to a CVD-coating process according to the following parameters:

A gas mixture of 3% $TiCl_4$, 1% CO, 3% $CH_4$ and balance $H_2$ was passed through the reaction vessel at a temperature of 1070° C. for 30 min at atmospheric pressure. This was followed by further coating with HfCN at 100 mbar, using a gas mixture of about 2% $HfCl_4$, 20% $N_2$ and 8% $CH_4$, balance $H_2$ and HfN using a gas mixture of about 2% $HfCl_4$, 20% $N_2$, balance $H_2$. The coating time was 2 and 8 hours respectively.

This resulted in a TiCO coating 1.3-1.5 μm thick and a HfCN coating 1-2 μm thick and a HfN coating 5 μm in thickness.

Etaphase could not be detected in any type of insert after etching with a Murakami solution.

EXAMPLE 11

Cemented carbide cutting inserts of types 1, 2 and 3 in Example 1 were subjected to a CVD-coating process according to the following parameters.

The reactor was heated to 1000° C. and evacuated to a pressure of 50 mbars.

A reaction gas mixture comprising 3% $TiCl_4$, 1% CO, 3% $CH_4$, balance $H_2$ was passed through the vessel for 15 min whereafter the $TiCl_4$ was replaced by the same amount of $SiCl_4$; a subsequent layer consisting of two phases, SiC and $SiO_2$, was then deposited for 15 min. This was followed by a deposition of SiC for 5 hours using a mixture of $SiH_4$, $CH_4$ and $H_2$.

The deposited TiCO-SiC/$SiO_2$ layer was altogether about 0.5 μm in thickness and the subsequent SiC layer 4-5 μm. Etaphase was not present in any of the cemented carbide inserts.

EXAMPLE 12

Cemented carbide cutting inserts of type 1, 2 and 3 in Example 1 were coated for 30 min with TiCO according to the process described in example 11.

Further coating of the inserts with $B_4C$ was made by passing a reaction gas mixture of 3% $BCl_3$, 3% $CH_4$, balance $H_2$ at 1050° C. and 67 mbars. A coating of 3 μm thickness was deposited.

The TiCO layer deposited had a thickness of 0.5-0.7 μm. Etaphase was not detectable in any of the substrate types after etching with a Murakami solution.

Neither in this example nor in example 11 any sign of interaction between B and Si and the cemented carbide was observed, strongly indicating that the intermediate layer reduces the diffusion of of e.g. B and Si from a deposited layer into the substrate.

EXAMPLE 13

Cemented carbide cutting inserts of types 1, 2 and 3 in Example 1 were submitted to a CVD-coating process according to the following parameters.

The reactor was heated to 1030° C. and evacuated to a pressure of 300 mbars. A reaction gas mixture comprising about 3% $VCl_4$, 1% CO, 3% $CH_4$, balance $H_2$ was passed through the reaction vessel for 30 min.

This procedure was followed by further coating of TiC 2 μm, VC 2 μm and TiN 3 μm in given order.

The VCO layer deposited had a thickness of 0.3-0.4 μm. No. etaphase could be detected.

EXAMPLE 14

Cemented carbide cutting inserts of type 1, 2 and 3 in example 1 were subjected to a CVD coating process according to the following parameters.

The inserts were heated to 1000° C. in a heat resistant vessel.

A reaction gas mixture of 3% $CH_4$, 1% CO and 3% $TiCl_4$ was passed through the reaction vessel for 15 min.

This was followed by further coating with TiC, $Al_2O_3$ and TiN. The coating thicknesses are displayed in Table 3.

EXAMPLE 15

Comparative Examples

Cemented carbide cutting inserts of type 1, 2 and 3 in example 1 were subjected to a CVD coating process corresponding to the process in example 14 but with the difference that no TiCO layer was applied. The resulting coating thicknesses are given in table 3.

TABLE 3

| Example | Sub-strate | Coating thickness, μm | | | | Etaphase |
|---------|------------|------|------|------|------|----------|
|         |            | TiCO | TiC  | $Al_2O_3$ | TiN |          |
| 14 | 1 | 0.5 | 5.5 | 2.5 | 0.5 | none |
| 14 | 2 | 0.5 | 5.3 | 2.5 | 0.5 | traces <1 μm |
| 14 | 3 | 0.5 | 5.7 | 2.3 | 0.5 | none |
| 15 | 1 |     | 5.4 | 2.5 | 0.5 | in edge 2 μm rake face 1 μm |
| 15 | 2 |     | 5.3 | 2.3 | 0.5 | in edge 4 μm rake face 2 μm |
| 15 | 3 |     | 5.6 | 2.4 | 0.5 | in edge 3 μm rake face 2 μm |

EXAMPLE 16

Cemented carbide cutting inserts of type 1, 2 and 3 of example 1 and titanium-based hard material inserts comprising 8% Co, 6% Ni, 16% WC, 39% TiC, 12% TiN, 6% TaC, 4% VC and 9% $Mo_2C$ were reactively sputter coated with TiCO in a PVD-coating apparatus based on a double magnetron configuration.

During the process cycle the substrates were located symmetrically between two identical cathodes equipped with Ti-targets.

Prior to the deposition of the coating, some of the substrates were cleaned by sputter etching in an argon atmosphere at a pressure of $43 \times 10^{-3}$ mbar and simultaneously heated to 400°-500° C. This process step is most important since the adhesion of the coating in general will be mediocre if the etching has not been properly done.

During the coating step the samples were rotated and subjected to a negative bias of −200 V. The coating step was performed at a pressure of $3 \times 10^{-3}$ mbar in a gas mixture of Ar and CO for about 3 min.

The coating process resulted in a TiCO layer of 1 μm in thickness.

Thereupon the inserts were transferred to a CVD reactor and coated with TiC and alumina according to the same parameters used in examples 14 and 15.

The resulting thicknesses were 1 μm TiCO (PVD coated), 5 μm TiC, 2.5 μm $Al_2O_3$ and 0.5 μm TIN.

Etaphase was not detected in any of the substrate types after etching in a Murakami solution. On the titanium-based hard material inserts no signs of decarburization were observed and no intermediate phases such as $Ni_3Ti$ had been formed.

Both the substrates that had been sputter etched and the unetched substrates showed excellent adhesion of the coatings to the substrates, demonstrating a further advantage of the interlayer.

This example clearly demonstrates the possibility of using an alternative process method for depositing the oxygen containing intermediate layer with the same advantageous effect as achieved by chemical vapour deposition.

EXAMPLE 17

The etaphase is known to cause damages in the edge line in certain operations where severe demands are put on the strength of the edge e.g. in milling, interrupted cuts.

Some inserts from the above mentioned experiments were subjected to a machining test especially designed to test the edge toughness of the cutting tool. The results are summarized in the table below.

| Sample | Coating layer | Edge line after test |
|--------|---------------|----------------------|
| Example 1 type 1 insert | TiCO + TiC 6 μm | Undamaged |
| Comparative type 1 insert | TiC 5 + $Al_2O_3$ 3 + TiN 0.5 | Severely damaged by chipping |
| Example 6 type 1 insert | TiCO + TiC 4.7 μm | Undamaged |
| Example 7 type 1 insert | TiC 4.0 μm | Severely damaged |
| Example 8 type 1 insert | TiCO + TiCN 2 μm | Small damages |
| Example 9 type 1 insert | TiCN 3 μm | Severely damaged |
| Example 14 type 1 insert | TiCO + TiC + $Al_2O_3$ + TiN | Undamaged |
| Example 14 type 3 insert | TiCO + TiC + $Al_2O_3$ + TiN | Undamaged |
| Example 15 type 1 insert | TiC + $Al_2O_3$ + TiN | Severely damaged |
| Example 15 type 3 insert | TiC + $Al_2O_3$ + TiN | Severely damaged |

We claim:

1. Coated body consisting of a substrate that can be decarburized during a carbide, nitride or carbonitride coating process comprising a first (innermost) carbon diffusion barrier coating selected from the group consisting of MetCO, MetCON and MetON atop and adjacent to the substrate and a second (next innermost) wear resistant coating of at least one layer of MetC, MetN or MetCN, where Met is Ti, Hf, V, Zr, Si, B or other metals of subgroup 3-7 of the periodic table of the elements, or a mixture thereof.

2. Coated body according to claim 1 where the first coating adjacent to the substrate consists of $MetC_xO_yN_z$ where $y > 0.1$ and $x+y+z < 1.3$.

3. Coated body according to claim 1 where the first coating adjacent to the substrate is a solid solution of MetC, MetO and MetN.

4. Coated body according to claim 1 in which the body consists of cemented carbide.

5. Coated body according to claim 1 in which the first coating is 0.05-5 μm thick, and the second coating is >0.2 μm thick.

6. Coated body according to claim 1 in which the first coating is thinner than the second.

7. Coated body according to claim 1 in which the said body has a third coating of alumina.

8. Coated body according to claim 1 in which the said body has an outermost coating of TiN.

9. Coated body according to claim 1 in which the said body has an outer coating which contains multiple layers.

10. Coated body according to claim 1 in which the substrate has a binder phase enriched surface zone.

11. Coated body according to claim 2 wherein the first coating adjacent to the substrate consists of $MetC_xO_yN_z$ where $y>0.2$ and $0.8<x+y+z<1.05$.

12. Coated body according to claim 5 in which the first coating is 0.1–2 $\mu$m thick and the second coating is 0.5–20 $\mu$m thick.

13. Coated body according to claim 3 wherein Met is Ti.

14. Coated body of a cemented carbide substrate that can be decarburized during a carbide, nitride or carbonitride coating process comprising a first (innermost) carbon diffusion barrier coating selected from the group consisting of MetCO, MetCON, and MetON adjacent to the substrate and a second (next innermost) wear resistant coating of at least one layer of MetC, MetN or MetCN, where Met is Ti, Hf, V, Zr, Si, B or other metals of subgroup 3–7 of the periodic table of the elements, or a mixture thereof.

15. Coated body according to claim 14 wherein the first coating adjacent to the substrate comprises $MetC_xO_yN_z$ where $y>0.1$ and $x+y+z<1.3$.

16. Coated body according to claim 14 wherein Met is Ti.

* * * * *